US006861667B2

(12) United States Patent
Gilk et al.

(10) Patent No.: US 6,861,667 B2
(45) Date of Patent: Mar. 1, 2005

(54) GROUNDING INSERTS

(75) Inventors: Mathew L. Gilk, Eagan, MN (US); John W. O'Sullivan, Hanover, MN (US); David A. Johnson, Wayzata, MN (US)

(73) Assignee: JohnsTech International Corporation, Minneapolis, MN (US)

( * ) Notice: Subject to any disclaimer, the term of this patent is extended or adjusted under 35 U.S.C. 154(b) by 0 days.

(21) Appl. No.: 10/619,895

(22) Filed: Jul. 15, 2003

(65) Prior Publication Data

US 2004/0106310 A1 Jun. 3, 2004

Related U.S. Application Data

(60) Provisional application No. 60/396,131, filed on Jul. 15, 2002.

(51) Int. Cl.[7] .......... H01L 23/58

(52) U.S. Cl. .......... 257/48; 324/765; 438/14

(58) Field of Search .......... 257/48; 438/14; 324/764, 765

(56) References Cited

U.S. PATENT DOCUMENTS

| | | | | | |
|---|---|---|---|---|---|
| 5,578,870 | A | * | 11/1996 | Farnsworth et al. | 257/727 |
| 5,639,247 | A | * | 6/1997 | Johnson et al. | 439/74 |
| 5,834,838 | A | * | 11/1998 | Anderson | 257/697 |
| 6,078,186 | A | * | 6/2000 | Hembree et al. | 324/755 |
| 6,168,449 | B1 | * | 1/2001 | Huang et al. | 439/259 |
| 6,262,581 | B1 | * | 7/2001 | Han | 324/755 |
| 2001/0025957 | A1 | * | 10/2001 | Takahashi | 257/48 |

* cited by examiner

*Primary Examiner*—W. David Coleman

(74) *Attorney, Agent, or Firm*—Nawrocki, Rooney & Sivertson, P.A.

(57) ABSTRACT

A grounding assembly for testing which can be readily changed is provided by an insert which is retained within an opening in a test socket. Flexible projections from the socket fit within grooves in the insert to provide the retention means. The insert is positioned within an opening in the socket adjacent to an opening containing a device under test (DUT). The insert is also between the DUT and a test board, and has contacts arranged such they connect ground contacts on the DUT to opposing contacts on the test board. The insert can provide different numbers, arrangements, and types of contacts as well as different materials for both the contact and contact body by merely changing the insert.

13 Claims, 4 Drawing Sheets

GROUNDING INSERTS

CROSS-REFERENCE TO RELATED APPLICATIONS

This is a regular application filed under 35 U.S.C. §111(a) claiming priority, under 35 U.S.C. §119(e)(1), of provisional application Ser. No. 60/396,131, previously filed Jul. 15, 2002 under 35 U.S.C. §111(b).

This invention relates to a variety of interchangeable grounding inserts to meet the various electrical, mechanical and thermal grounding requirements for test apparatus using only a single insert. The ground insert is rapidly "snapped" in and out of a test housing to provide all of the required ground interconnections between a device under test (DUT) and test apparatus.

BACKGROUND OF THE INVENTION

The concept of using interchangeable ground inserts to meet the multiple ground requirements of various equipment under test in test apparatus is not known in the industry.

SUMMARY OF THE INVENTION

An interchangeable apparatus utilizes a variety of inserts, which can be quickly inserted and removed from a cavity to provide the various electrical, mechanical and thermal options for a variety of equipment under test. This arrangement provides the user with great flexibility in grounding arrangements combined with rapid and easy changeover from one apparatus under test to another by simply "snapping" an insert in place.

Various ground connections for connecting the grounds of variety of devices under test to test equipment through a test socket utilize this essentially planar insert which has a variety of conductive circuit materials, contact materials and arrangements and various insulating materials. The inserts match an opening in the test socket arranged to rapidly receive and lock the insert in place. These various options can include rigid, compliant and non-compliant contacts which are available in such materials as copper or Au/Ni. The body of the insert can be made of materials which include Torlon or copper. The insert proper and socket cavity can also be provided in a variety of sizes for further flexibility. The above contact materials, contact arrangement, contact number and location, contact body and size can readily be extended for future applications.

DETAILED DESCRIPTION OF THE INVENTION

Figure 1:
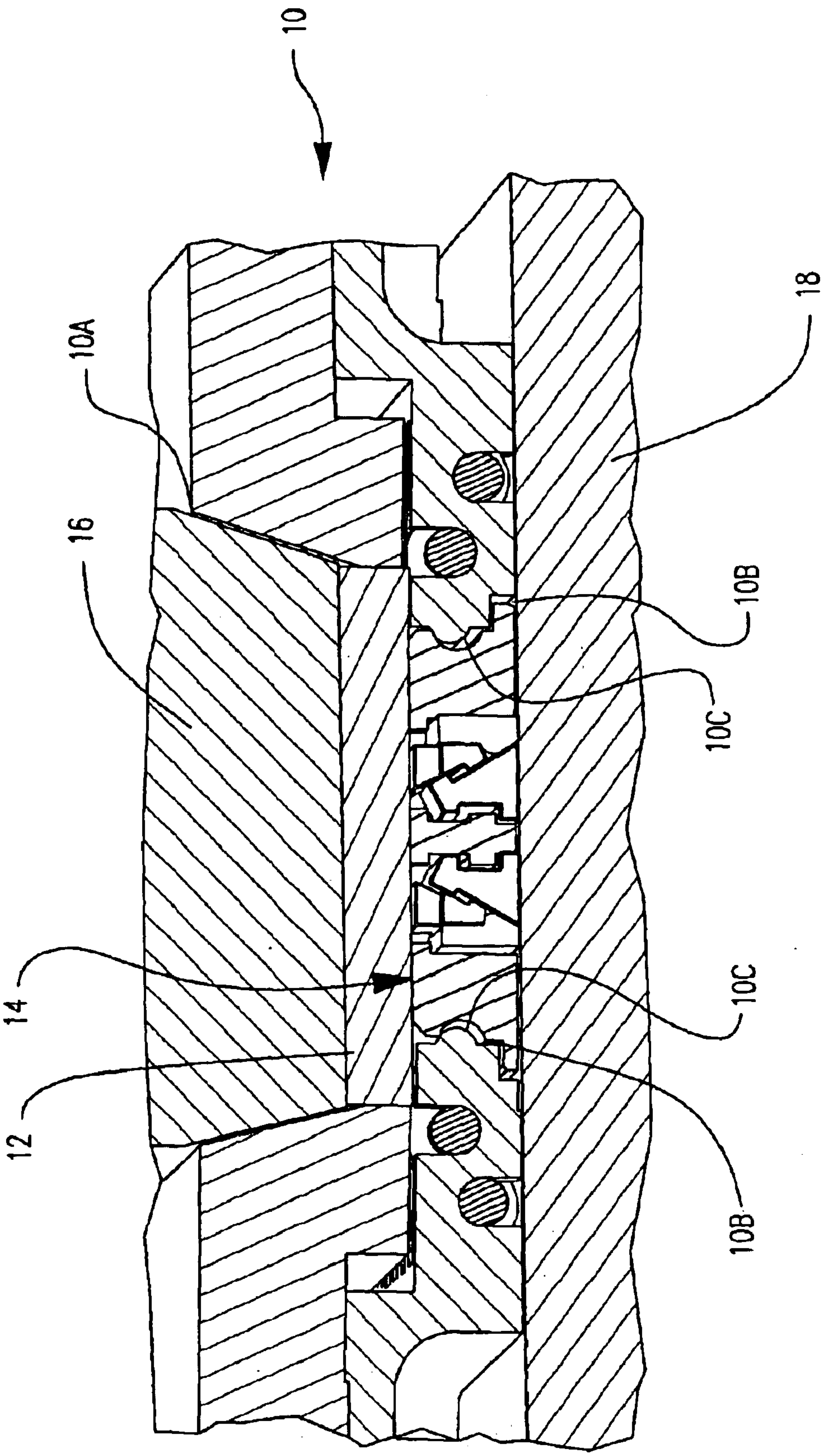
FIG. 1 shows a test socket housing with a lead backer, DUT and an insert in cross-section mounted in place, positioned adjacent a test board.
Figure 2:
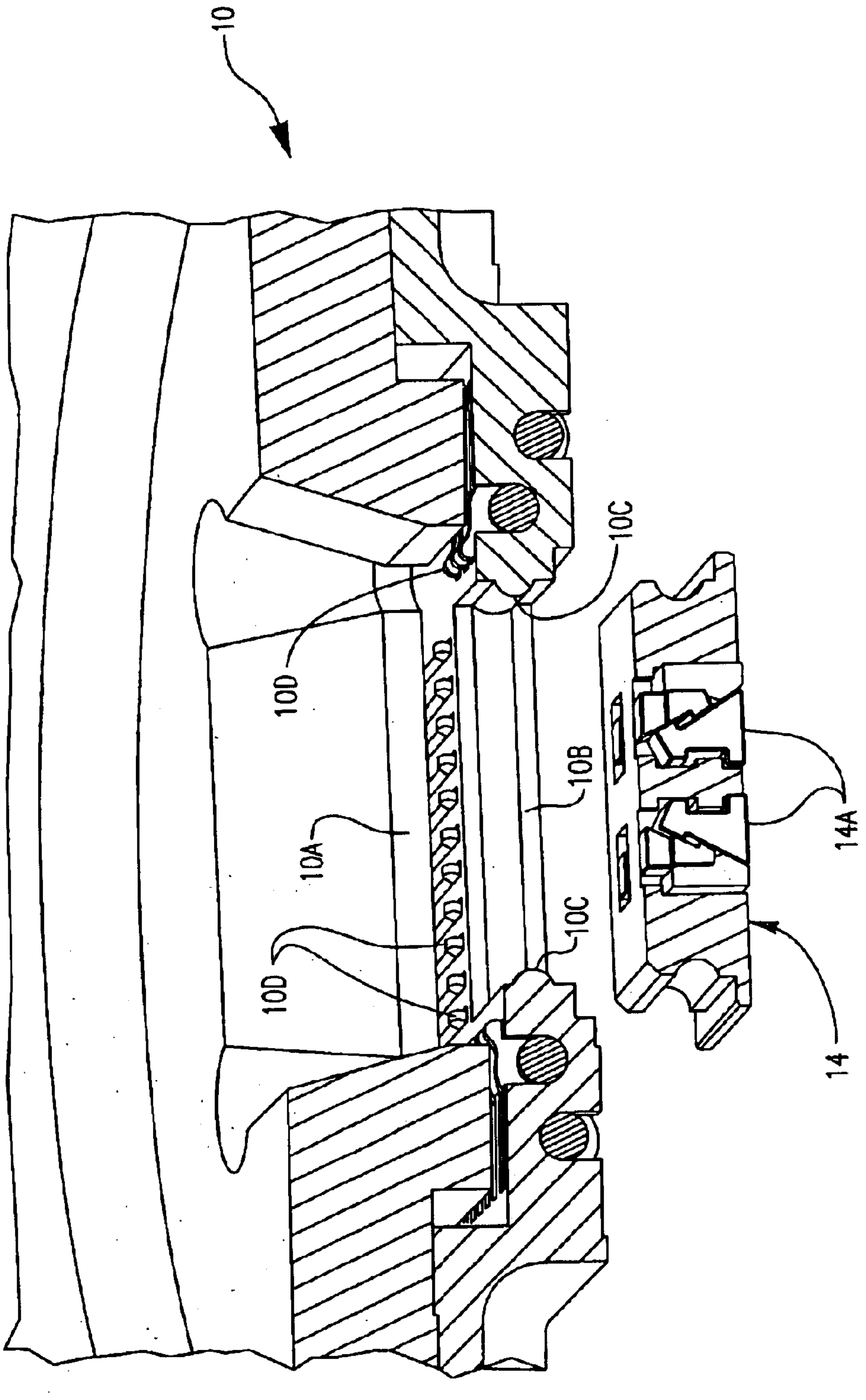
FIG. 2 shows the test socket and a ground insert in cross-section before mounting.
Figure 3:
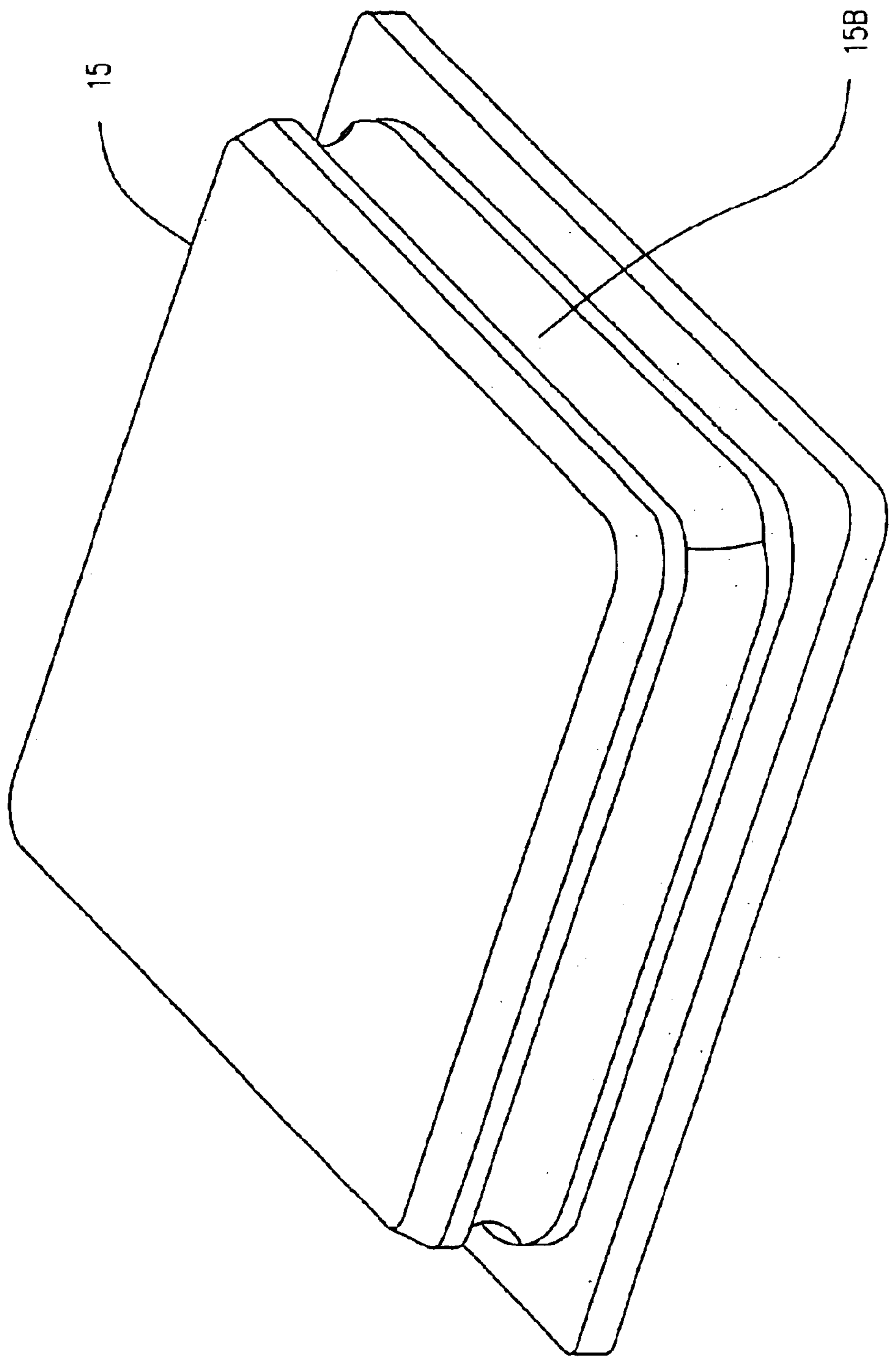
FIG. 3 shows an insert without contacts.
Figure 4:
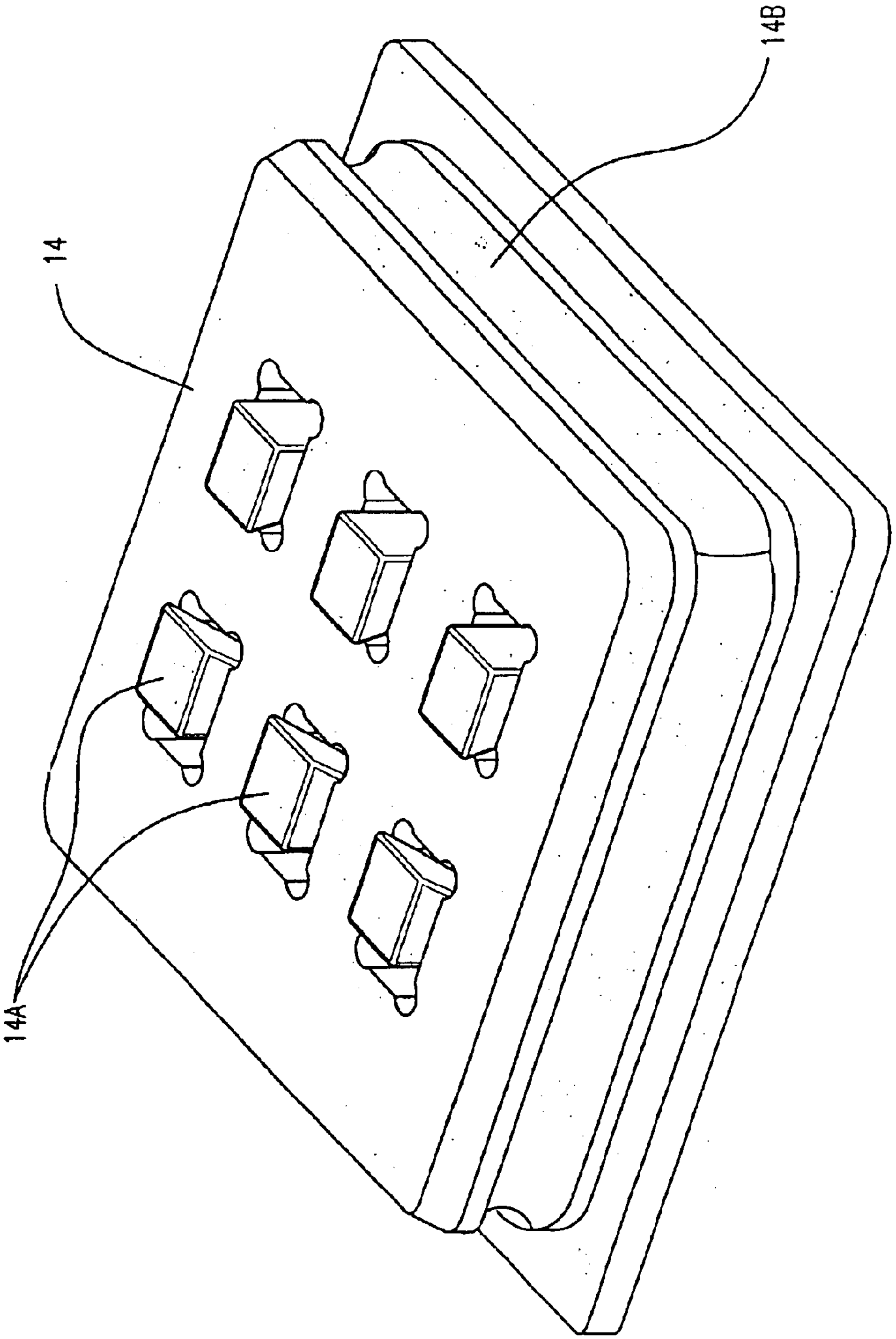
FIG. 4 shows an insert with multiple contacts.

An arrangement for receiving and holding a grounding apparatus is shown in FIG. 1, representative inserts 14, 15 being shown in FIGS. 2 and 3. Test socket 10 has an opening 10A sized to accept a DUT 12, and an opening 10B sized to receive, as shown in FIG. 2, an insert 14. A lead backer 16, sized to fit within opening 10A is positioned immediately above DUT 12. Lead backer 16 is pressed downward against DUT 12 during test. This function is provided by other elements of socket 10 which are well known in the art. Test board 18 is positioned below insert 14. Insert 14 has contacts 14A which extend upwardly through the insert 14 to DUT 12 and downward to test board 18 to provide the required ground connections for the DUT.

FIG. 2 shows insert 14 positioned within insert opening 10B. Recess 14B in insert 14 is sized to mate with bead 10C of socket 10. Bead 10C is made of an elastic material to permit deformation by insert 14, such that the insert can be locked into insert opening 10B. Insert 14 can be positioned most readily into opening 10B by first inclining the insert 14 and positioning the closest portion of recess 14B over the adjacent portion of bead 10C on one end, and then pressing the opposite end inward until the opposite portion of recess 14B engages the bead 10C on that side. This operation can be described simply as "snapping" insert 14 into insert opening 10B.

After insert 14 is placed within insert opening 10B, as described above, DUT 12, lead backer 16 and test board 18 are positioned as shown in FIG. 1. With this configuration, when socket 10 has lead backer 16 urged against DUT 12, contacts 14A will provide the proper ground connections between the DUT 12 and test board 18. At the same time, active test contacts 10D will provide the proper active voltage connections between DUT 12 and test board 18.

The contacts shown here are known in the art as CBC, i.e. compliant or "floating contacts", which are urged outwardly by elastomeric material. Any contact arrangement known in the art will suffice that will provide a connection between opposed mating contacts from the DUT 12 to the test board 18. Other contacts can include such options as S contacts and copper inserts.

In another embodiment, no contacts are provided. Insert 15 is typically made of either copper or Torlon. When insert 15 is made of copper and the insert is placed within insert opening 10B as described above, a simple ground surface for the ground connection to test board 18 is provided. When insert 15 is made of Torlon and placed within insert opening 16 as described above, a spacer to permit setting up the mechanical arrangements of socket 10 before testing is started is provided.

Inserts 14 and 15 are shown here as having a square configuration. This arrangement permits ready location of bead 10C opposite recess 14B to facilitate securement of the insert 14 in place. While a square has four orientations that will fit within a mating opening, appropriate opposing index marks on each side of insert 14 (not shown) can be provided to ensure correct alignment. While a square insert is illustrated here, any configuration which will ensure a desired orientation between opposing projections and grooves will suffice. This includes such shapes as rectangular or even oval shaped areas.

Providing ground contacts for ground connections results in a smaller area for grounding area than utilizing the entire area for a ground connection. Where multiple contacts are required, this can be compensated for in the design of the handler by providing a larger insert area. The area can be extended considerably to compensate for any loss of grounding area.

An insert for permit rapid change of grounding arrangements can utilize, in addition to those described above, such things as new combination of contacts, contact arrangements, contact materials and insert materials as long as they can be configured and operate as described above.

It will be understood that this disclosure, in many respects, is only illustrative. Changes may be made in details, particularly in matters of shape, size, material, and arrangement of parts without exceeding the scope of the invention. Accordingly, the scope of the invention is as defined in the language of the appended claims.

What is claimed is:

1. Replaceable grounding apparatus for test socket apparatus, comprising:

a) an insert having opposed and essentially parallel first and second surfaces;

b) a generally planar circuit board having opposed and essentially parallel first and second surfaces and a surface area larger than that of the insert;

c) a handler having a planar handler element with an outer essentially first planar surface essentially parallel to an opposite outer essentially planar third surface, and a second planar surface located therebetween essentially parallel to the first and second surfaces and wherein:

i) the handler element has a first opening extending from the first to the second surfaces with the element being sized and arranged to accept the circuit board in a predetermined orientation and with the first plane of the circuit board essentially aligned with the first plane of the handler element and the second plane of the circuit board essentially aligned with the second plane of the handler element;

ii) the handler element having a second opening opposite the first opening extending between the second and the third surface with the insert and second opening being sized and arranged to accept the insert in a predetermined orientation and with the first surface of the insert aligned with the second plane of the fixed element, and the second surface of the insert aligned with the third plane of the handler element; and d) securing and releasing means for securing and releasing the insert with respect to the second opening.

2. Apparatus as in claim 1 wherein the insert is made of copper.

3. Apparatus as in claim 1 wherein the securing and releasing means comprises at least opposed grooves extending from the periphery between the first and second surfaces of the insert, and flexible projections extending inward from the second opening of the housing element arranged such that when the insert is in the preferred orientation and within the second opening the projections will engage the grooves.

4. Apparatus as in claim 3 wherein the insert surfaces have an essentially square shape.

5. Grounding apparatus as in claim 1 further comprising:

a) the second surface of the circuit board having at least two ground connectors arranged such that when the circuit board is positioned within the first opening in the predetermined orientation the ground connectors will abut the second surface of the handler; and b) the insert having conductors extending from the first to the second surface of the insert numbered and located such that when the circuit board and the insert are mounted in their predetermined orientations respectively in the first and second openings of the handler element each ground connector on the second surface of the circuit board will be opposite a conductor.

6. Apparatus as in claim 5 wherein the insert is made of torlon.

7. In automated test equipment utilizing a lead backer, test socket, test board and housing for testing a DUT interposed between the lead backer and test socket, the housing including a planar surface facing the lead backer with an opening into the housing forming a recess sized to receive the DUT in a coplanar relationship with the planar surface, a grounding connection improvement comprising:

a) an insert having opposed and essentially parallel surfaces with smaller surface areas than the recess opening;

b) the housing having an insert opening directly opposite the DUT recess extending inward to the DUT recess, the insert opening being sized and arranged to contain the insert with the outer surface of the insert aligned and parallel with the outer edge of the insert opening, with the opening being opposite at least a portion of the test board; and c) securing and releasing means for securing and releasing the insert from within the insert opening.

8. Apparatus as in claim 7 wherein the insert is made of copper.

9. Apparatus as in claim 7 wherein the insert further comprises a groove around the periphery between its surfaces, and wherein the securing and releasing means comprises opposed flexible beads extending inwardly around the periphery of the insert opening arranged such that when the insert is within the insert opening the projections will engage the groove.

10. Apparatus as in claim 9 wherein the insert surfaces have an essentially square shape.

11. Apparatus as in claim 7 wherein the insert is made of non-conducting material.

12. Apparatus as in claim 7 wherein the insert is made of torlon.

13. Grounding apparatus as in claim 11 has at least two ground conducting paths extending between the planar surfaces with each conducting path which terminate at opposite parallel surfaces.

* * * * *